United States Patent
Lee et al.

(10) Patent No.: US 8,404,590 B2
(45) Date of Patent: Mar. 26, 2013

(54) PLASMA PROCESSING METHOD AND STORAGE MEDIUM

(75) Inventors: Sung Tae Lee, Yamanashi (JP); Kazuya Dobashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 65 days.

(21) Appl. No.: 13/189,715

(22) Filed: Jul. 25, 2011

(65) Prior Publication Data

US 2012/0021538 A1    Jan. 26, 2012

Related U.S. Application Data

(60) Provisional application No. 61/376,079, filed on Aug. 23, 2010.

(30) Foreign Application Priority Data

Jul. 26, 2010  (JP) ................................. 2010-166805

(51) Int. Cl.
    *H01L 21/00* (2006.01)
(52) U.S. Cl. ........ 438/689; 438/694; 438/720; 438/725; 438/963; 257/E21.09; 257/E33.008
(58) Field of Classification Search .................. 438/689, 438/694, 720, 725, 963; 257/E21.09, 33.008
    See application file for complete search history.

(56) References Cited

U.S. PATENT DOCUMENTS

| 4,501,061    | A  * | 2/1985  | Wonnacott ..................... 438/694 |
| 4,978,594    | A  * | 12/1990 | Bruce et al. ..................... 430/14 |
| 7,767,365    | B2 * | 8/2010  | Carpenter et al. ................. 438/5 |
| 2003/0104697 | A1 * | 6/2003  | Chang et al. .................. 438/689 |
| 2005/0201924 | A1 * | 9/2005  | Ramani et al. ............. 423/576.8 |
| 2010/0068631 | A1 * | 3/2010  | Lee et al. ........................... 430/5 |
| 2010/0176369 | A2 * | 7/2010  | Oliver et al. .................... 257/13 |

FOREIGN PATENT DOCUMENTS

| JP | 09-082688   | A | 3/1997 |
| JP | 2009-159849 | A | 7/2009 |
| JP | 2009-200459 | A | 9/2009 |

* cited by examiner

*Primary Examiner* — Michael Lebentritt
(74) *Attorney, Agent, or Firm* — Pearne & Gordon LLP

(57) ABSTRACT

There is provided a plasma processing method performing a plasma etching process on an oxide film of a target substrate through one or more steps by using a processing gas including a CF-based gas and a COS gas. The plasma processing method includes: performing a plasma etching process on the oxide film of the target substrate according to a processing recipe; measuring a concentration of sulfur (S) remaining on the target substrate (residual S concentration) after the plasma etching process is performed according to the processing recipe; adjusting a ratio of a COS gas flow rate with respect to a CF-based gas flow rate (COS/CF ratio) so as to allow the residual S concentration to become equal to or smaller than a predetermined value; and performing an actual plasma etching process according to a modified processing recipe storing the adjusted COS/CF ratio.

13 Claims, 10 Drawing Sheets

US 8,404,590 B2

PLASMA PROCESSING METHOD AND STORAGE MEDIUM

CROSS-REFERENCE TO RELATED APPLICATION

This application claims the benefit of Japanese Patent Application No. 2010-166805 filed on Jul. 26, 2010 and U.S. Provisional Application Ser. No. 61/376,079 filed on Aug. 23, 2010, the entire disclosures of which are incorporated herein by reference.

FIELD OF THE INVENTION

The present disclosure relates to a plasma processing method for performing a plasma etching process on an oxide film by using a CF-based gas and a COS gas.

BACKGROUND OF THE INVENTION

In a manufacturing process of a semiconductor device, a plasma etching process has been performed for forming a pattern. In the plasma etching process of an oxide film, a CF-based gas has been conventionally used as an etching gas.

For the plasma etching process of the oxide film, a method of adding a carbonyl sulfide (COS) gas to the CF-based gas is described in Patent Document 1.

Recently, with the miniaturization of a hole diameter when etching the oxide film to form a hole pattern, it is getting more and more important to control a hole shape after the etching process. Especially, since a bowing is one of prime causes for a decrease in a production yield, the method of adding the COS gas is being attempted in order to ameliorate the problem.

Patent Document 1: Japanese Patent Laid-open Publication No. H09-082688

However, it was found out that sulfur (S) remains on a target substrate after performing the plasma etching process on the oxide film by using the CF-based gas and the COS gas. Since the sulfur (S) may have an adverse effect on human's health if a concentration of the sulfur (S) remaining on the target substrate is high, it would be very important to control the residual sulfur (S) concentration.

BRIEF SUMMARY OF THE INVENTION

In view of the foregoing, the present disclosure provides a plasma processing method capable of controlling a concentration of sulfur (S) remaining on a target substrate to a preset value or less after performing a plasma etching process on an oxide film by using a CF-based gas and a COS gas. The present disclosure also provides a storage medium storing a program for implementing the plasma processing method.

In accordance with a first aspect of the present disclosure, there is provided a plasma processing method for performing a plasma etching process on an oxide film of a target substrate through one or more steps by using a processing gas including a CF-based gas and a COS gas. The plasma processing method includes: performing a plasma etching process on the oxide film of the target substrate according to a processing recipe; measuring a concentration of sulfur (S) remaining on the target substrate (residual S concentration) after the plasma etching process is performed according to the processing recipe; adjusting a ratio of a COS gas flow rate with respect to a CF-based gas flow rate (COS/CF ratio) so as to allow the residual S concentration to become equal to or smaller than a predetermined value; and performing an actual plasma etching process according to a modified processing recipe storing the adjusted COS/CF ratio.

In accordance with a second aspect of the present disclosure, there is provided a plasma processing method for performing a plasma etching process on an oxide film of a target substrate through one or more steps by using a processing gas including a CF-based gas and a COS gas. The plasma processing method includes: investigating a relationship between a ratio of a COS gas flow rate with respect to a CF-based gas flow rate (COS/CF ratio) during a plasma etching process and a concentration of sulfur (S) remaining on the target substrate (residual S concentration) after the plasma etching process is performed; determining the COS/CF ratio within a range in which the residual S concentration does not exceed a predetermined value; and performing a plasma etching process based on the determined COS/CF ratio.

In accordance with a third aspect of the present disclosure, there is provided a plasma processing method for performing a plasma etching process on an oxide film of a target substrate through one or more steps by using a processing gas including a CF-based gas and a COS gas. The plasma processing method includes: performing a plasma etching process on the oxide film of the target substrate according to a processing recipe; measuring a concentration of sulfur (S) remaining on the target substrate (residual S concentration) after the plasma etching process is performed according to the processing recipe; adjusting a product ((COS/CF)×etching time) of a ratio of a COS gas flow rate with respect to a CF-based gas flow rate and an etching time for performing a plasma etching process by using the processing gas including the CF-based gas and the COS gas, so as to allow the residual S concentration to become equal to or smaller than a predetermined value; and performing an actual plasma etching process according to a modified processing recipe storing the adjusted (COS/CF)×etching time.

In accordance with a fourth aspect of the present disclosure, there is provided a plasma processing method for performing a plasma etching process on an oxide film of a target substrate through one or more steps by using a processing gas including a CF-based gas and a COS gas. The plasma processing method includes: investigating a relationship between a product ((COS/CF)×etching time) of a ratio of a COS gas flow rate with respect to a CF-based gas flow rate during a plasma etching process and an etching time for performing the plasma etching process by using the processing gas including the CF-based gas and the COS gas and a concentration of sulfur (S) remaining on the target substrate (residual S concentration) after the plasma etching process is performed; determining the value of ((COS/CF)×etching time) within a range in which the residual S concentration does not exceed a predetermined value; and performing a plasma etching process based on the determined value of ((COS/CF)×etching time).

In accordance with a fifth aspect of the present disclosure, there is provided a computer-readable storage medium storing therein a program for controlling a plasma processing apparatus. The program, when executed on a computer, controls the plasma processing apparatus to perform a plasma processing method in any one of the first to the fourth aspects.

In accordance with the present disclosure, the present inventors discovered that the residual S concentration on the target substrate can be controlled by using the COS/CF ratio. Based on the above discovery, the residual S concentration on the target substrate is first measured after the plasma etching process is performed on the oxide film of the target substrate according to a certain processing recipe. Then, the COS/CF ratio or the value of ((COS/CF)×etching time) is adjusted so as to allow the residual S concentration to become equal to or smaller than a predetermined value. Under these conditions, the actual plasma etching process is performed. Accordingly, the residual S concentration can be controlled to be equal to or smaller than the predetermined value.

Further, the relationship between the COS/CF ratio and the residual S concentration or the relationship between the value of ((COS/CF)×etching time) and the residual S concentration is investigated in advance. Then, the COS/CF ratio or the value of ((COS/CF)×etching time) is determined within the range in which the residual S concentration does not exceed the predetermined value. Thereafter, the plasma etching process is performed by using the determined COS/CF ratio or (COS/CF)×etching time. Accordingly, the residual S concentration can be controlled to be equal to or smaller than the predetermined value.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, non-limiting embodiments of the present disclosure will be described in detail with reference to the accompanying drawings.

Figure 1:
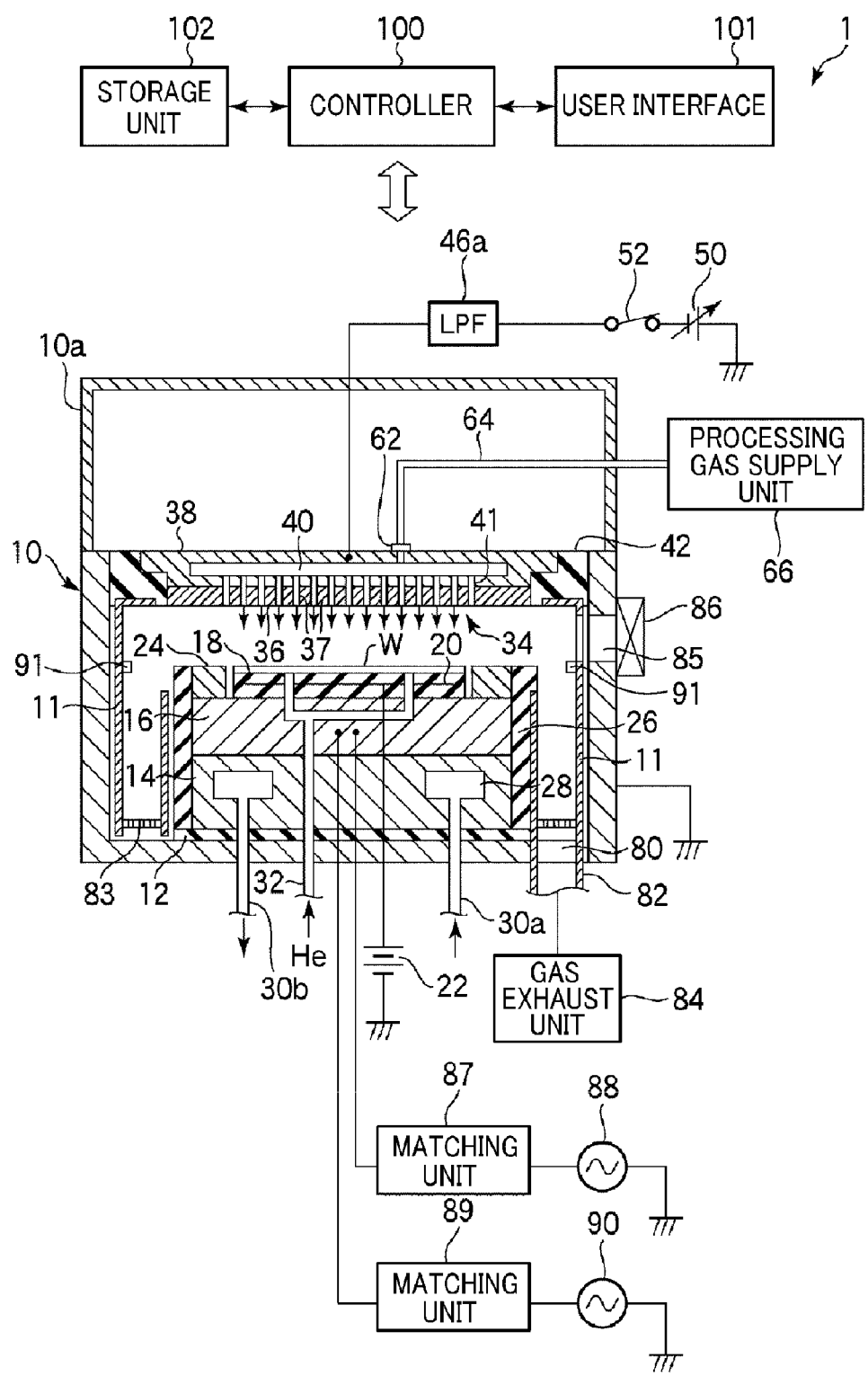
FIG. 1 is a schematic cross sectional view illustrating an example plasma processing apparatus for performing a plasma processing method in accordance with the present disclosure.

FIG. 1 is a schematic cross sectional view illustrating an example plasma processing apparatus for performing a plasma processing method in accordance with the present disclosure. Here, it should be noted that the apparatus for performing the plasma processing method may not be limited to the example of FIG. 1.

A plasma processing apparatus 1 may be a capacitively coupled parallel plate type plasma etching apparatus. The plasma processing apparatus 1 may include a substantially cylindrical chamber (processing vessel) 10 made of, e.g., aluminum of which surface is anodically oxidized. The chamber 10 may be frame-grounded.

A cylindrical susceptor support 14 may be provided on a bottom of the chamber 10 with an insulating plate 12 made of, e.g., ceramics provided therebetween. A susceptor 16 made of, e.g., aluminum is provided on the susceptor support 14. The susceptor 16 serves as a lower electrode and mounts thereon a semiconductor wafer W (a target substrate) having an oxide film ($SiO_2$ film) to be etched.

An electrostatic chuck 18 for attracting and holding the semiconductor wafer W by an electrostatic force may be provided on a top surface of the susceptor 16. The electrostatic chuck 18 may include an electrode 20 made of a conductive film between a pair of insulating layers or insulating sheets. The electrode 20 is electrically connected with a DC power supply 22. The semiconductor wafer W is attracted to and held on the electrostatic chuck by an electrostatic force such as a Coulomb force generated by a DC voltage from the DC power supply 22.

A conductive focus ring (correction ring) 24 made of, e.g., silicon, for improving an etching uniformity is provided on the top surface of the susceptor 16 so as to surround the electrostatic chuck 18 (semiconductor wafer W). Further, a cylindrical inner wall member 26 made of, e.g., quartz is provided on side surfaces of the susceptor 16 and the susceptor support 14.

Further, a coolant cavity 28 is formed within the susceptor support 14 on a circumference, for example. A coolant, such as cooling water of a certain temperature, is supplied and circulated into the coolant cavity 28 from a non-illustrated chiller unit, which is provided outside of the plasma processing apparatus, through coolant lines 30a and 30b. Accordingly, it is possible to control a processing temperature of the semiconductor wafer W on the susceptor 16 by the coolant.

Moreover, a heat transfer gas such as a He gas is supplied between a top surface of the electrostatic chuck 18 and a rear surface of the semiconductor wafer W through a gas supply line 32 from a non-illustrated heat transfer gas supply unit.

Above the susceptor 16 serving as the lower electrode, an upper electrode 34 is provided so as to face the susceptor 16 in parallel. A space between the upper and lower electrodes 34 and 16 is a plasma generation space. The upper electrode 34 has a surface (facing surface) facing the semiconductor wafer W on the susceptor 16 serving as the lower electrode. This facing surface is in contact with the plasma generation space.

The upper electrode 34 is supported at a top portion of the chamber 10 by an insulating shielding member 42. The upper electrode 34 may include an electrode plate 36 facing the susceptor 16 and provided with a multiple number of gas discharge holes 37; and an electrode support 38 for detachably supporting the electrode plate 36. The electrode support 38 is made of a conductive material such as aluminum and has a water-cooling structure. Desirably, the electrode plate 36 may be made of a conductor or a semiconductor having a low resistance with low Joule's heat. Further, it may be also desirable that the electrode plate 36 is made of a silicon-containing material in order to reinforce a resist, as will be described later. To be specific, the electrode plate 36 may be made of silicon or SiC, desirably. A gas diffusion space 40 is formed within the electrode support 38, and a multiple number of gas through holes 41 communicating with the gas discharge holes 37 are extended downwardly from the gas diffusion space 40.

A gas inlet 62 for introducing processing gases into the gas diffusion space 40 is provided on the electrode support 38, and the gas inlet 62 is connected with a gas supply pipe 64. The processing gases are supplied from a processing gas supply unit 66 through the gas supply pipe 64. In accordance with the present embodiment, a CF-based gas such as a $C_4F_6$ gas or a $CF_4$ gas and a COS gas may be used as the processing gases. Further, if necessary, another gas such as an AR gas or an $O_2$ gas may be additionally used. The processing gas supply unit 66 may include supply sources for the respective processing gases and each processing gas is supplied into the gas supply pipe 64 via each pipeline. A flow rate controller such as a mass flow controller (MFC) and a valve are provided on each pipeline for supplying each processing gas. The processing gas is supplied into the gas diffusion space 40 from the processing gas supply unit 66 through the gas supply pipe 64. Then, the processing gas is discharged into the plasma generation space via the gas through holes 41 and the gas discharge holes 37 as in a shower device. That is, the upper electrode 34 serves as a shower head for supplying the processing gas.

The upper electrode 34 is electrically connected with a variable DC power supply 50 via a low pass filter (LPF) 46*a*. The variable DC power supply 50 may be a bipolar power supply. A power supply from the variable DC power supply 50 may be controlled to be on or off by an on/off switch 52.

The low pass filter (LPF) 46*a* may trap high frequency components outputted from a first and a second high frequency power supply to be described later. Desirably, the low pass filter (LPF) 46*a* may include an LR filter or an LC filter.

A cylindrical ground conductor 10*a* is upwardly extended from a sidewall of the chamber 10 to be higher than the upper electrode 34.

The susceptor 16 serving as the lower electrode is electrically connected with a first high frequency power supply 88 via a first matching unit 87. The first high frequency power supply 88 outputs a high frequency power in a range of about 27 MHz to about 100 MHz, e.g., about 40 MHz. The first matching unit 87 matches a load impedance with an internal (or output) impedance of the first high frequency power supply 88. When plasma is being generated in the chamber 10, the first matching unit 87 renders the output impedance of the first high frequency power supply 88 and the load impedance be apparently matched with each other.

Further, the susceptor 16 serving as the lower electrode is also electrically connected with a second high frequency power supply 90 via a second matching unit 89. As a high frequency power is supplied from the second high frequency power supply 90 to the susceptor 16 serving as the lower electrode, a high frequency bias power is applied to the semiconductor wafer W. Accordingly, ions are attracted toward the semiconductor wafer W. The second high frequency power supply 90 outputs a high frequency power in a range of about 400 kHz to about 20 MHz, e.g., about 13 MHz. The second matching unit 89 is configured to match a load impedance with an internal (or output) impedance of the second high frequency power supply 90. When plasma is being generated in the chamber 10, the second matching unit 89 makes the internal impedance of the second high frequency power supply 90 and the load impedance including the plasma within the chamber 10 be apparently matched with each other.

An exhaust port 80 is formed at a bottom of the chamber 10, and the exhaust port 80 is connected with a gas exhaust unit 84 via an exhaust line 82. The gas exhaust unit 84 may include a vacuum pump such as a turbo molecular pump so that the gas exhaust unit 84 can depressurize the inside of the chamber 10 to a predetermined vacuum level. Further, a loading/unloading port 85 for the semiconductor wafer W is formed at a sidewall of the chamber 10. The loading/unloading port 85 can be opened and closed by a gate valve 86. Furthermore, detachably provided along an inner wall of the chamber 10 is a deposition shield 11 that prevents an etching byproduct (deposit) from adhering to the inside of the chamber 10. That is, the deposition shield 11 forms a chamber inner wall. The deposition shield 11 is also provided at an outer periphery of the inner wall member 26. At a bottom of the chamber 10, an exhaust plate 83 is provided between the deposition shield 11 at the chamber inner wall and the deposition shield 11 at the inner wall member 26. The deposition shield 11 and the exhaust plate 83 may be made of aluminum coated with ceramics such as $Y_2O_3$.

A conductive member 91 (GND block), which is DC-connected to the ground, is provided on the deposition shield 11 forming the chamber inner wall at the substantially same height as that of the wafer W. With this configuration, an abnormal electric discharge can be prevented.

Each component of the plasma processing apparatus, such as a power supply system, a gas supply system, a driving unit, the first high frequency power supply 88, the second high frequency power supply 90, the matching units 87 and 89, the DC power supply 50 or the like, may be connected with and controlled by a controller 100 (overall control unit) having a microprocessor (computer). The controller 100 may be connected with a user interface 101 including a keyboard through which an operator inputs a command to manage the plasma processing apparatus, and a display on which an operation status of the plasma processing apparatus is displayed.

Further, the controller 100 may be connected with a storage unit 102 for storing therein a control program and a processing recipe. The controller 100 may control various kinds of processes performed in the plasma processing apparatus according to the control program. Further the processing recipe may allow each component of the plasma processing apparatus to perform a process according to a processing condition. The processing recipe is stored in a storage medium of the storage unit 102. The storage medium may be a hard disc or a semiconductor memory, or may be a portable medium such as a CD-ROM, a DVD, and a flash memory. Alternatively, the processing recipe may be appropriately received from an external apparatus through, e.g., a dedicated line.

If necessary, a processing recipe may be retrieved from the storage unit 102 and executed by the controller 100 in response to an instruction from the user interface 101. Accordingly, a required process is performed in the plasma processing apparatus by the controller 100.

Now, a plasma processing method in accordance with an embodiment of the present disclosure, which is performed by the plasma processing apparatus having the above-described configuration, will be explained.

Figure 2:
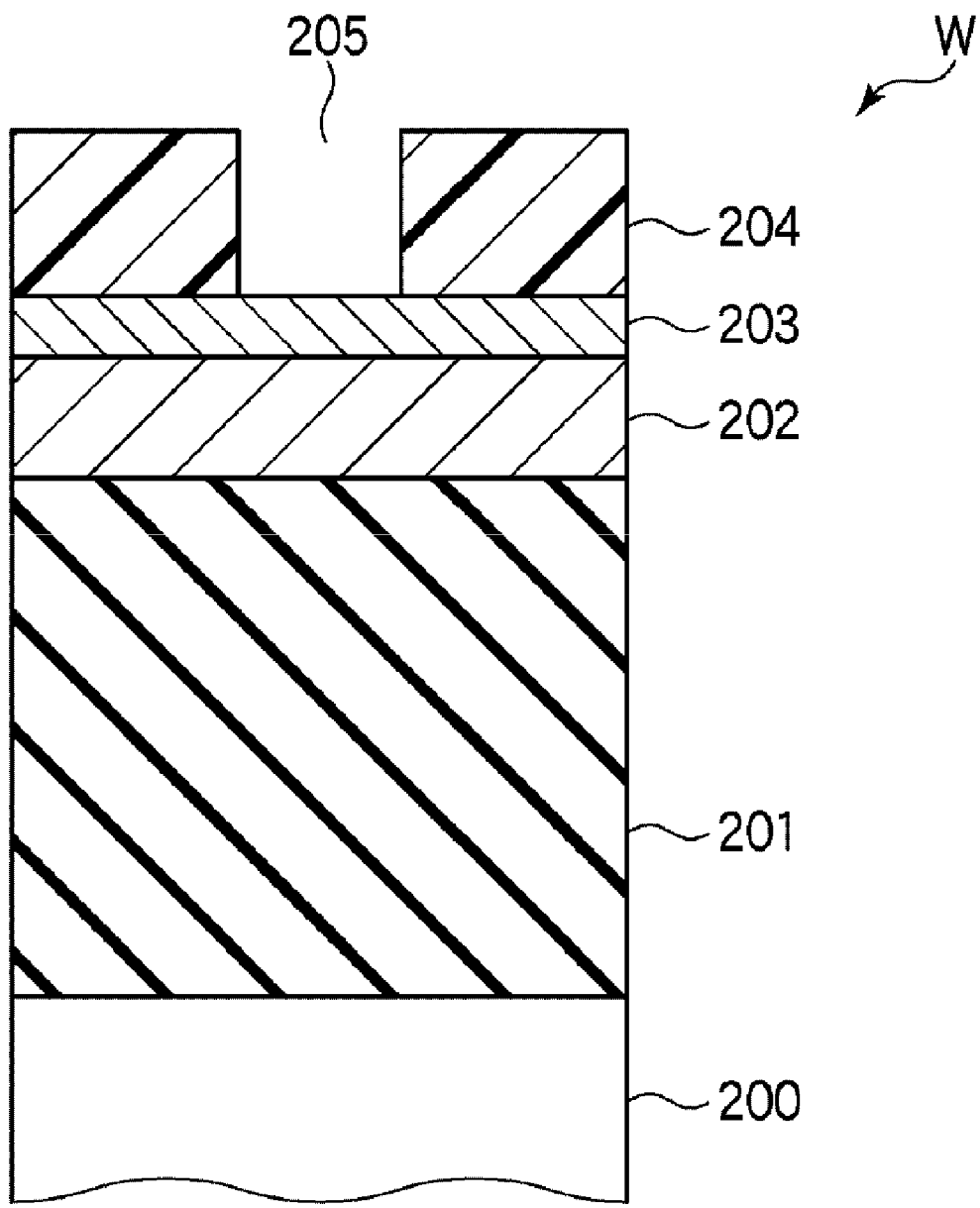
FIG. 2 is a diagram schematically illustrating an example structure of a semiconductor wafer used in the plasma processing method in accordance with the present disclosure.

In the present embodiment, a semiconductor wafer W as illustrated in FIG. 2 is used as a processing target object. As for an example structure of the semiconductor wafer W, an oxide film ($SiO_2$ film) 201 to be etched, a lower resist layer 202, a bottom anti-reflection coating (BARC) 203 and a photoresist film 204 are formed on a silicon substrate 200 in sequence. Referring to FIG. 2, an opening 205 for etching is formed in the photoresist film 204 by forming a certain pattern through a photolithography.

Under a state shown in FIG. 2, the bottom anti-reflection coating (BARC) 203 and the lower resist layer 202 are etched by using the photoresist film 204 as a mask. Then, the oxide film ($SiO_2$ film) 201 is etched by using the lower resist layer 202 as a mask.

First, the gate valve 86 is opened, and the semiconductor wafer W having the structure as illustrated in FIG. 2 is loaded into the chamber 10 through the loading/unloading port 85 and mounted on the susceptor 16. Then, the inside of the chamber 10 is evacuated by the gas exhaust unit 84. At the same time, a processing gas is supplied into the gas diffusion space 40 from the processing gas supply source 66 at a preset flow rate. The supplied processing gas is introduced into the chamber 10 via the gas through holes 41 and the gas discharge holes 37. Then, the high frequency power is applied, and the bottom anti-reflection coating (BARC) 203 and the lower resist layer 202 are etched by plasma of the processing gas. Subsequently, in order to etch the oxide film ($SiO_2$ film) 201, the inside of the chamber 10 is evacuated by the gas exhaust unit 84. At the same time, the processing gas is supplied into the gas diffusion space 40 from the processing gas supply source 66 at a preset flow rate. The supplied processing gas is introduced into the chamber 10 via the gas through holes 41 and the gas discharge holes 37. At this time, an internal pressure of the chamber 10 is controlled to be a predetermined value such as about 20 mTorr (2.66 Pa) or less.

The processing gas may include a CF-based gas as a main etching gas and a COS gas as an additive gas. Further, if necessary, another gas such as an Ar gas or an $O_2$ gas may also be used. Here, the CF-based gas refers to a gas containing C and F, such as a $CF_4$ gas, a $C_4F_6$ gas, a $C_4F_6$ gas, a $C_5F_B$ gas, a $C_3F_8$ gas, a $C_6F_6$ gas, a $CH_2F_2$ gas or a $CHF_3$ gas.

After the processing gas is introduced into the chamber 10 at the preset flow rate, a high frequency power for generating plasma, having a relatively high frequency of about 27 MHz to about 100 MHz, e.g., about 40 MHz, is applied to the susceptor 16 serving as the lower electrode from the first high frequency power supply 88. Further, a high frequency power for attracting ions, having a frequency in the range of about 400 kHz to about 20 MHz, e.g., about MHz, which is lower than the frequency of the high frequency power for generating plasma, is applied to the susceptor 16 as a high frequency bias power from the second high frequency power supply 90. Further, if necessary, a negative DC voltage is applied to the susceptor 16 from the DC power supply 50. As a result, the processing gas is excited into plasma, and a plasma etching process is performed on the oxide film ($SiO_2$ film) 201 of the semiconductor wafer W. In case that a self bias power generated by the first high frequency power 88 is sufficient as a high frequency bias power, it may not be necessary to supply the high frequency power from the second high frequency power supply 90. When the plasma is generated, by applying the DC voltage from the DC power supply 22 to the electrode 20 of the electrostatic chuck 18, the wafer W is held on the electrostatic chuck 18.

Then, the processing gas discharged from the gas discharge holes 37 formed in the electrode plate 36 of the upper electrode 34 is excited into plasma by a glow discharge. The glow discharge occurs between the upper electrode 34 and the susceptor 16 serving as the lower electrode by the high frequency power. Accordingly, the oxide film ($SiO_2$ film) 201 is etched by ions or radicals generated by the plasma. Here, generally, the etching process may be performed through multi-steps including a main etching and an over etching performed under different conditions after the main etching. However, it is also possible to perform the etching process through a single step.

During the etching process, since the COS gas is added to the CF-based gas used as a main etching gas, a bowing can be suppressed during the etching process. To elaborate, by adding the COS gas to the processing gas such as a $C_4F_6$ gas, an Ar gas, and an $O_2$ gas, a bowing CD can be reduced to about 2 nm as compared to a case without adding the COS gas.

However, when the COS gas is used as the processing gas, sulfur (S) contained in a molecule of the COS gas may remain on the wafer. If a concentration of the sulfur (S) remaining on the wafer (hereinafter, simply referred to as a "residual S concentration") is high, it may have an adverse effect on human's health. Since a TLV (Threshold Limit Value: This refers to a concentration of sulfur (S) in the air to which a worker can be repeatedly exposed for eight hours per day (for 48 hours per week) without adverse health effects) is determined to be equal to or smaller than about ppm, the residual S concentration also needs to be determined to be equal to or smaller than about 10 ppm.

Conventionally, however, no systematic investigation on the residual S concentration has been conducted, and, thus, it has not been found out which parameters affect the residual S concentration.

Figure 3:
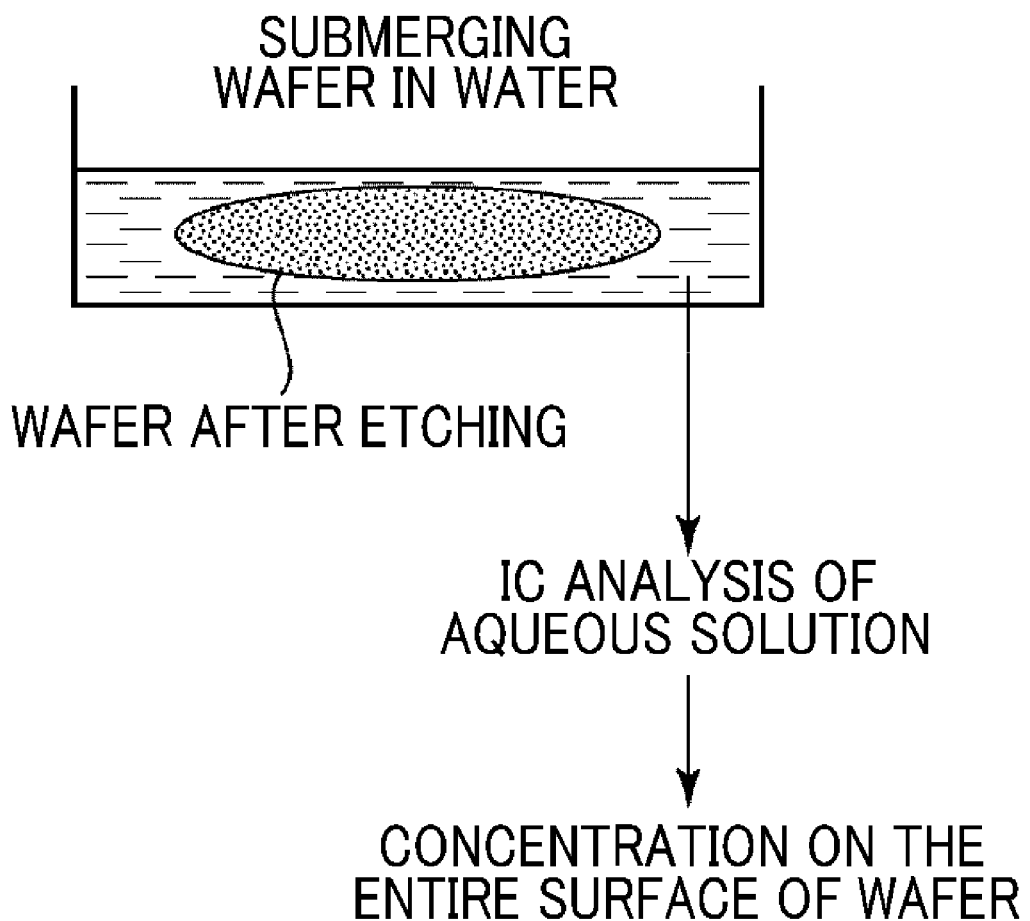
FIG. 3 is a schematic diagram for describing a dissolution test for measuring a residual sulfur (S) concentration remaining on an entire surface of a wafer.
Figure 4:
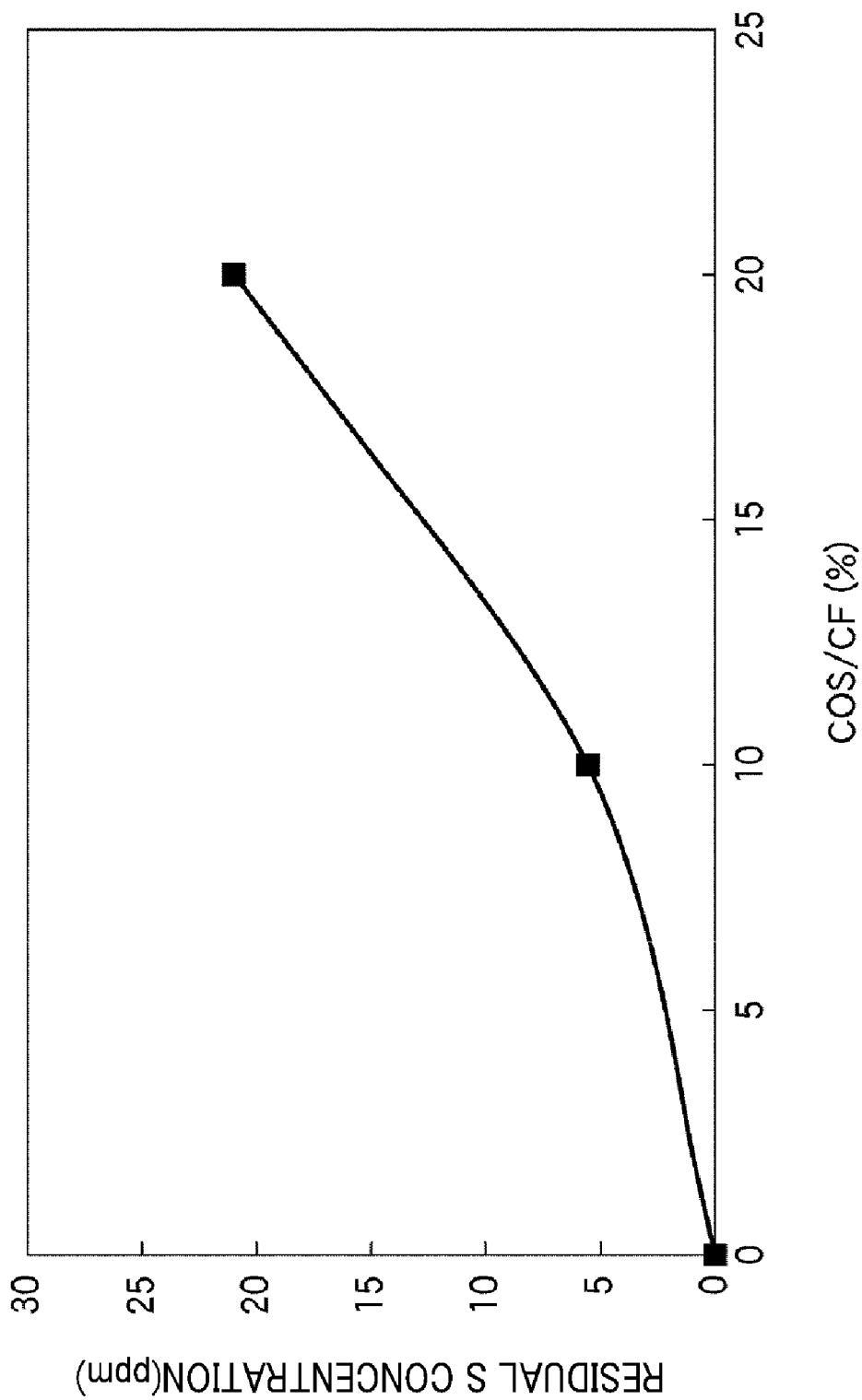
FIG. 4 is a graph showing a relationship between a COS/CF ratio and a residual S concentration measured by the dissolution test.
Figure 5:
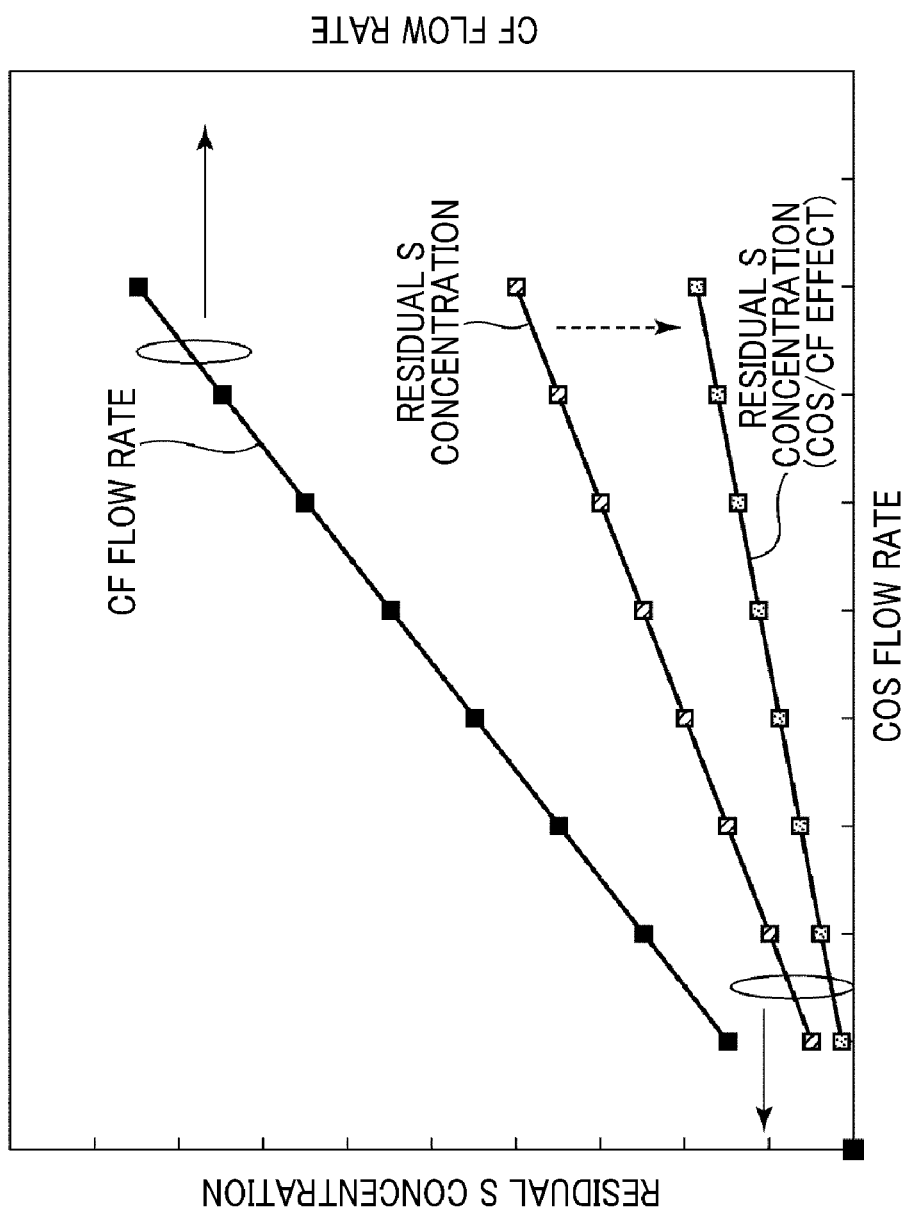
FIG. 5 is an image diagram for explaining that a residual S concentration can be controlled by adjusting a COS/CF ratio.
Figure 6:
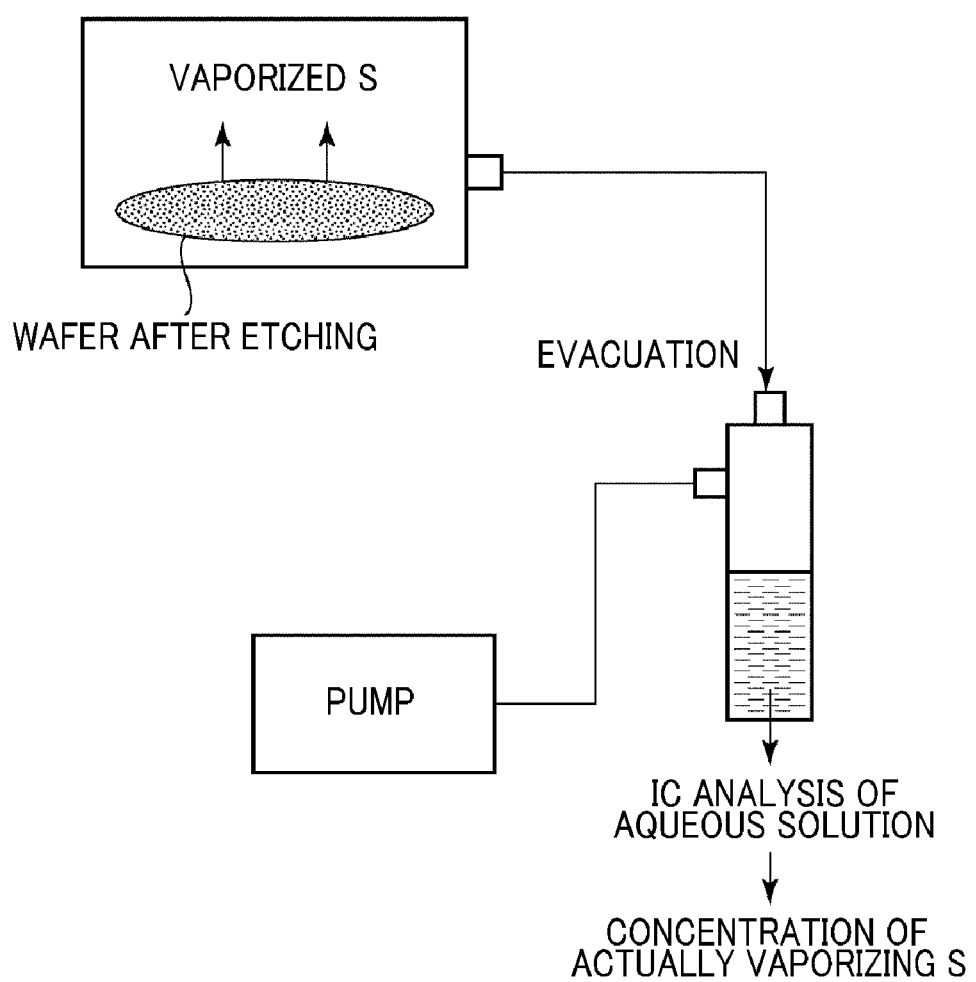
FIG. 6 is a schematic diagram for describing an impinger test for measuring a sulfur (S) concentration that is actually vaporizing in the air.

In view of this, the present inventors investigated conditions related to the residual S concentration on the wafer. Here, after an etching process is performed on the wafer while varying etching conditions, the wafer is submerged in water, as illustrated in FIG. 3. Then, an ion chromatography (IC) analysis of an aqueous solution in which the sulfur (S) is dissolved is conducted, and a residual S concentration on the entire surface of the wafer is measured (dissolution test). As a result, it is found out that there is a strong correlation between a residual S concentration and a ratio of a COS gas flow rate with respect to a CF-based gas flow rate (COS/CF ratio), and that the residual S concentration increases as the COS/CF ratio increases. In other words, it is found out that the residual S concentration can be controlled by adjusting the COS/CF ratio. To elaborate, as can be seen from FIG. 5, if only the COS gas flow rate is increased, the residual S concentration may increase. However, if the CF-based gas flow rate increases, the COS/CF ratio decreases. Accordingly, an increment of the residual S concentration can be reduced by increasing the CF-based gas flow rate. Further, FIG. 4 shows a result of performing the etching process under the conditions as follows: an internal pressure of the chamber is about 20 mT (2.66 Pa); the first and second high frequency powers are about 1800 W and about 4500 W, respectively; a DC voltage is about −1150 V; the CF-based gas flow rate is maintained at about 68 sccm while the COS gas flow rate is about 0 sccm, about 6.8 sccm, and about 13.6 sccm, respectively (the COS/CF ratio is about 0%, about 10% and about 20%); and an etching time is about 60 sec.

Figure 7:
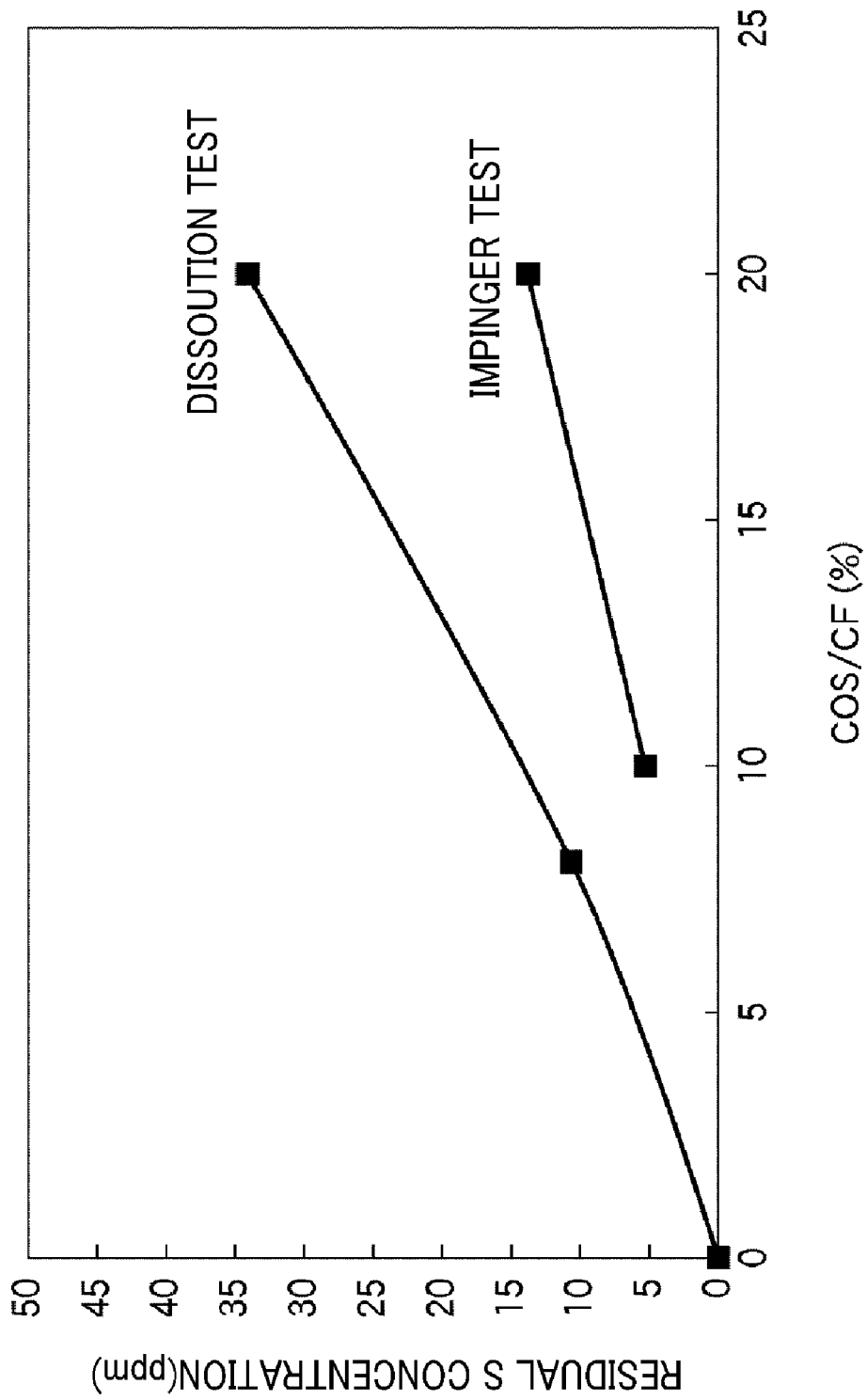
FIG. 7 is a graph showing a relationship between COS/CF ratios and residual S concentrations measured by the dissolution test and the impinger test.

Since the TLV refers to a concentration of a substance in the air, it is required to measure a concentration of sulfur (S) that is actually vaporizing in the air among the sulfur (S) remaining on the wafer. This concentration may be measured by an impinger test involving the steps of: loading the wafer, on which the etching process has been performed, into a dedicated FOUP; evacuating the inside of the FOUP by a pump; dissolving an evacuated gas in water; and conducting an IC analysis on dissolved sulfur (S). In comparison of the relationship between the residual S concentrations and the COS/CF ratios by the dissolution test and the impinger test, both tests show the same tendency, as illustrated in FIG. 7. That is, both tests show that the residual S concentration increases as the COS/CF ratio increases. Further, FIG. 7 shows a result of performing the etching process under the conditions as follows: the internal pressure of the chamber is about 20 mT (2.66 Pa); the first and second high frequency powers are about 400 W and about 4500 W, respectively; the DC voltage is about −1150 V; the CF-based gas flow rate is maintained at about 68 sccm while the COS gas flow rate varies; and an etching time is about 60 sec.

Table 1 shows COS/CF ratios (%), residual S concentrations (ppm), COS gas flow rates×etching time and (COS/CF)×etching time when the etching process is actually performed under mass production conditions (Condition 1 to 5). Further, the residual S concentrations in Table 1 are obtained by the impinger test. Among the COS/CF ratios indicated in double rows, an upper row shows a condition for the main etching and a lower row shows a condition for the over etching.

TABLE 1

| Conditions | COS/CF (%) | Residual S Concentration | COS flow rate × etching time | COS/CF × etching time |
|---|---|---|---|---|
| 1 | 3.3 / 5.6 | 9.0 | 1015 | 1126 |
| 2 | 13.5 | 4.7 | 225 | 608 |
| 3 | 8.2 / 28.6 | 18.5 | 520 | 900 |
| 4 | 7.3 / 10 | 8.0 | 660 | 1248 |
| 5 | 8.2 / 11 | 3.2 | 400 | 548 |

As shown in Table, 1, when the COS/CF ratio is equal to or smaller than about 13.5%, the residual S concentration is equal to or smaller than about 10 ppm. However, under the condition 3 where the COS/CF ratio in the over etching is as high as about 28.6%, the residual S concentration is about 18.5 ppm, which exceeds the TLV. In the condition 5 where the COS/CF ratio in the over etching of the condition 3 is reduced to about 11%, the residual S concentration is reduced to about 3.2 ppm. From these results, it is found that the residual S concentration can be controlled by adjusting the COS/CF ratio. Further, except the condition 3, a correlation is found between the value of COS/CF×etching time and the residual S concentration. Thus, it is also found that the residual S concentration can also be controlled by adjusting the value of COS/CF×etching time when the COS/CF ratio is not excessively high.

Figure 8:
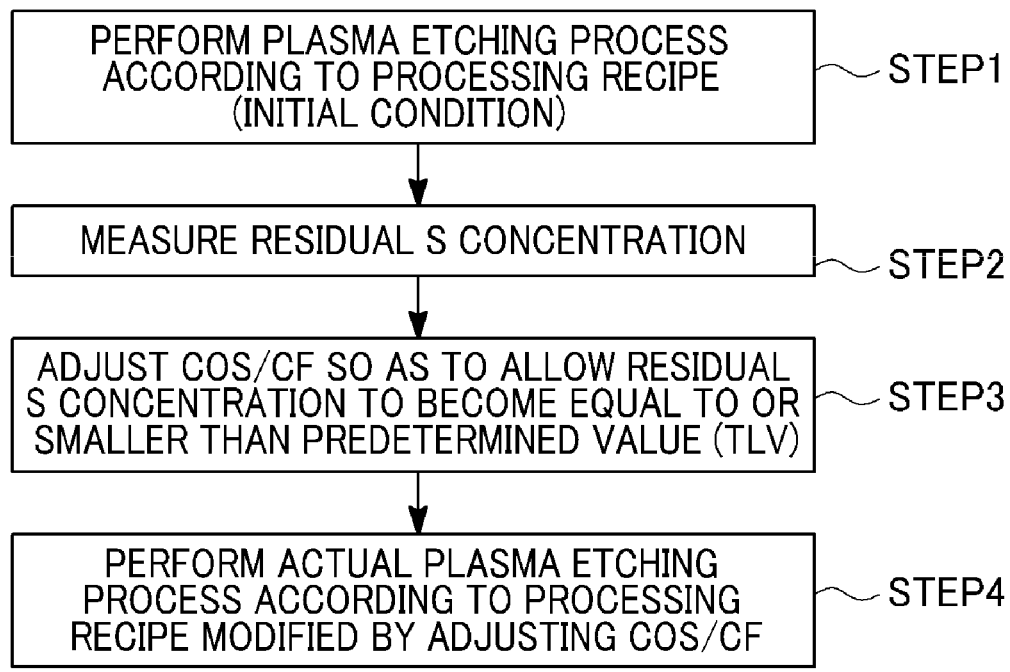
FIG. 8 is a flowchart for describing a plasma processing method in accordance with an embodiment of the present disclosure.

As described above, the residual S concentration can be controlled by the COS/CF ratio. Referring to FIG. 8, a plasma etching process is performed according to a processing recipe (initial condition) including a COS gas as a processing gas (step 1); a residual S concentration is measured (step 2); a COS/CF ratio in the processing recipe is adjusted so as to allow the residual S concentration to become equal to or smaller than a predetermined value (typically, the TLV) (step 3); and an actual etching process is performed according to a modified processing recipe storing the adjusted COS/CF ratio (step 4).

To elaborate, if the residual S concentration exceeds the predetermined value (typically, the TLV) under the initial condition, after decreasing the COS/CF ratio in the processing recipe, the actual etching process may be performed according to the modified processing recipe. In order to decrease the COS/CF ratio, a COS gas flow rate may be decreased or a CF-based gas flow rate may be increased, or both of which may be performed. At this time, the COS gas flow rate and the CF-based gas flow rate need to be controlled within a range in which a bowing suppressing effect, which is a purpose of adding the COS gas, can be achieved. Furthermore, after the actual etching process is performed according to the modified processing recipe, a residual S concentration may be measured again. These processes (adjusting process, actual plasma etching process, and measuring process) may be repeated until the residual S concentration becomes equal to or smaller than the predetermined value.

Meanwhile, if the residual S concentration is equal to or smaller than the predetermined value under the initial condition, the COS/CF ratio need not be controlled to meet a requirement of the residual S concentration. In order to suppress the bowing, however, it may be possible to increase the COS/CF ratio in the processing recipe within a tolerance range of the residual S concentration and perform the plasma etching process according to this modified processing recipe.

Figure 9:
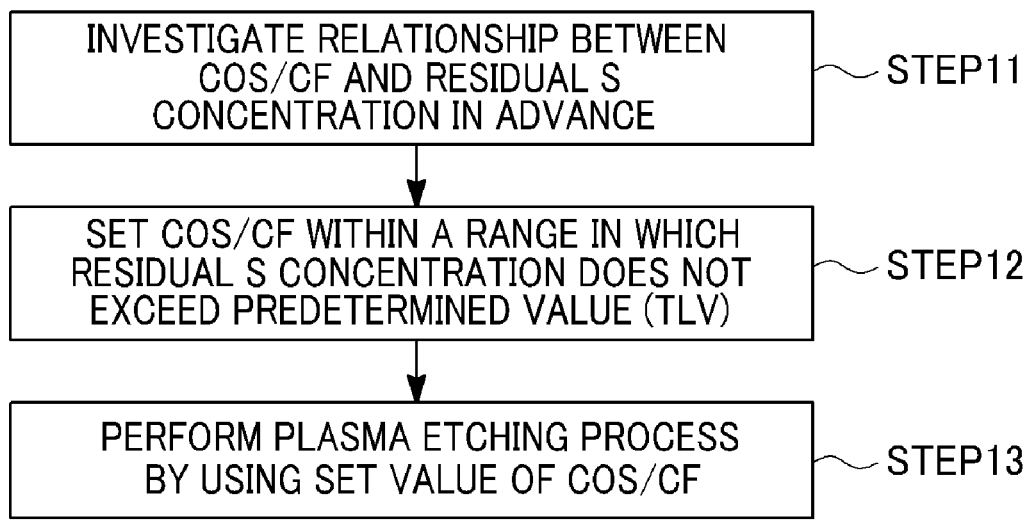
FIG. 9 is a flowchart for describing a plasma processing method in accordance with another embodiment of the present disclosure.

Further, as depicted in FIG. 9, a relationship between the COS/CF ratio and the residual S concentration may be investigated for every basic processing recipe in advance (step 11); the COS/CF ratio may be determined within a range in which the residual S concentration does not exceed a predetermined value (typically, the TLV) (step 12); and a plasma etching process may be performed based on the determined COS/CF ratio (step 13). In view of the result shown in Table 1, it may be desirable that the COS/CF ratio is equal to or smaller than about 13.5% and, more desirably, equal to or smaller than about 10% in order to meet a higher requirement for the safety. However, the desired COS/CF ratio may vary depending on a basic processing recipe, and even a higher COS/CF ratio may be acceptable. In order to suppress the bowing, it may be desirable to control a COS gas flow rate and a CF-based gas flow rate so as to obtain a desired COS gas flow rate capable of suppressing the bowing within the previously investigated tolerance range of the COS/CF ratio.

Figure 10:
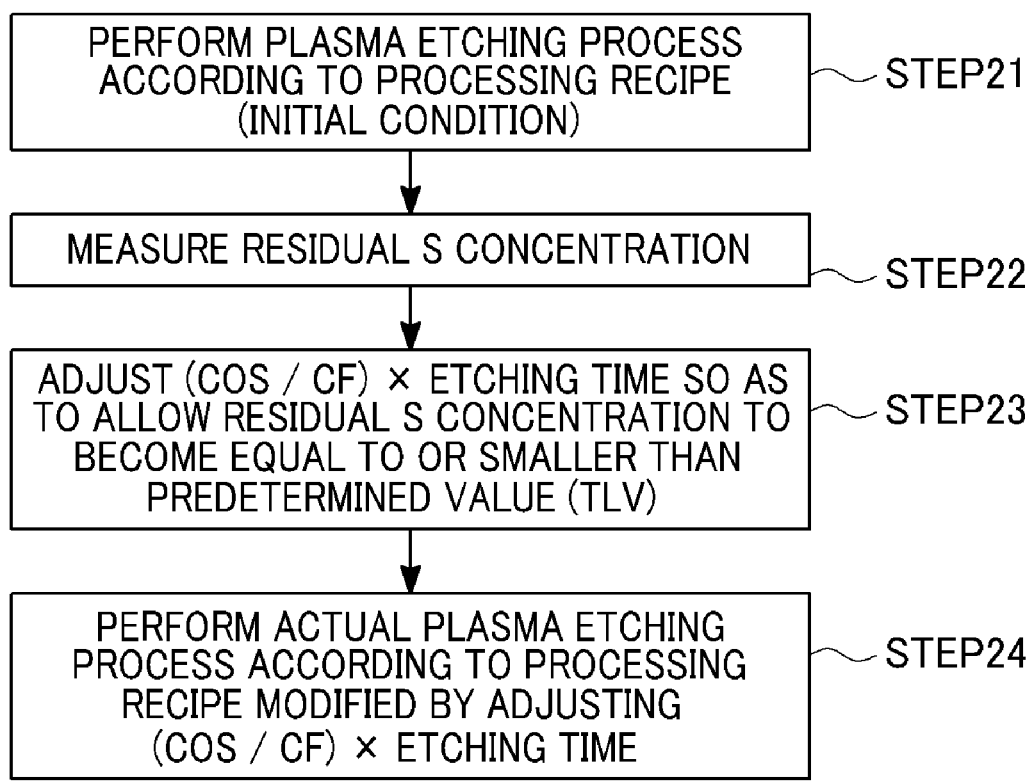
FIG. 10 is a flowchart for describing a plasma processing method in accordance with sill another embodiment of the present disclosure.

Instead of using the relationship between the residual S concentration and the COS/CF ratio, it may be also possible to use the relationship between the residual S concentration and the (COS/CF)×etching time. In such a case, as illustrated in FIG. 10, an etching process is performed according to a processing recipe (initial condition) using the COS gas as the processing gas (step 21); a residual S concentration is measured (step 22); a value of (COS/CF)×etching time in the processing recipe is adjusted so as to allow the residual S concentration to become equal to or smaller than a predetermined value (typically, the TLV) (step 23); and an actual etching process is performed according to a modified processing recipe storing the adjusted (COS/CF)×etching time (step 24).

To elaborate, if the residual S concentration exceeds the predetermined value (typically, the TLV) under the initial condition, the value of (COS/CF)×etching time in the processing recipe may be reduced and the actual etching process may be performed according to this modified processing recipe. The value of (COS/CF)×etching time may be decreased by at least one of reducing a COS gas flow rate, increasing a CF-based gas flow rate and reducing an etching time. Meanwhile, if the residual S concentration is equal to or smaller than the predetermined value under the initial condition, the value of (COS/CF)×etching time need not be controlled to meet a requirement of the residual S concentration. If it is required to increase the COS gas flow rate in order to suppress the bowing, however, it may be possible to increase the value of (COS/CF)×etching time in the processing recipe within the tolerance range of the residual S concentration and perform the plasma etching process according to this modified processing recipe.

Figure 11:
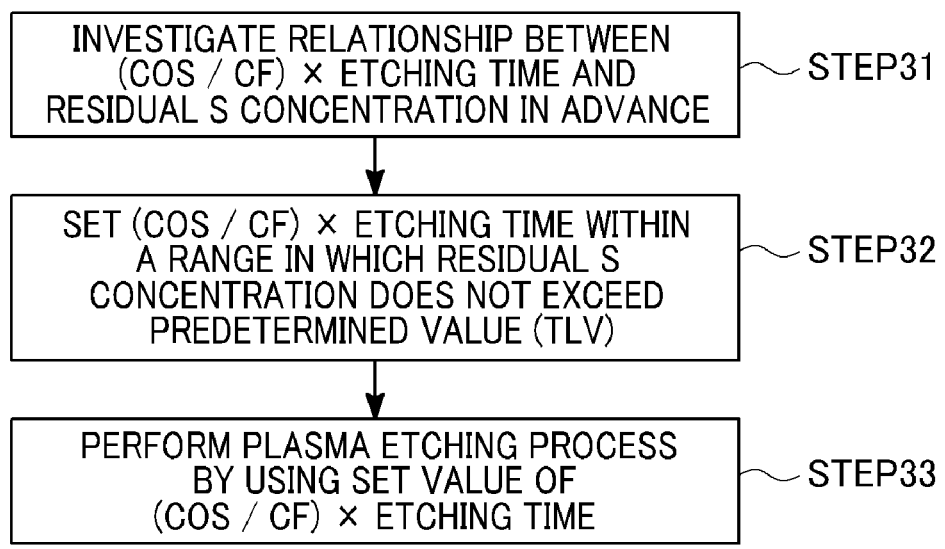
FIG. 11 is a flowchart for describing a plasma processing method in accordance with still another embodiment of the present disclosure.

Furthermore, as depicted in FIG. 11, a relationship between the residual S concentration and the value of (COS/CF)×etching time is investigated for every basic processing recipe in advance (step 31); the value of (COS/CF)×etching time is determined within a range in which the residual S concentration does not exceed a predetermined value (typically, the TLV) (step 32); and a plasma etching process is performed under this newly determined condition (step 33).

Further, the sulfur (S) remaining on the wafer may be removed by oxygen plasma. In order to perform the oxygen plasma process on every wafer, however, a processing time equal to or greater than about 10 seconds is additionally required for every single sheet of wafer, which is deemed to be not available. For this reason, the present disclosure suggests the method of reducing the residual S concentration to a predetermined value or below without performing such an additional process.

Furthermore, it should be noted that the present disclosure is not limited to the above-described embodiments but can be modified in various ways. By way of example, although the plasma processing method in accordance with the embodiments of the present disclosure has been described to be performed by the apparatus that applies dual high frequency powers of different frequencies to the lower electrode, the present disclosure is not limited thereto. By way of example, a single high frequency power for plasma generation may be applied to the lower electrode while a high frequency power may be applied to the upper electrode. Alternatively, a high frequency power for plasma generation may be applied to the upper electrode while a high frequency power for bias may be applied to the lower electrode. Further, instead of the $SiO_2$ film, another oxide film such as TEOS or BPSG may be used as an etching target film. Moreover, a DC voltage need not necessarily be applied to the upper electrode. Further, although the semiconductor wafer is used as the target substrate in the above embodiments, the target substrate may not be limited to the semiconductor wafer but may be another substrate such as a FPD (Flat Panel Display) or the like.

What is claimed is:

1. A plasma processing method for performing a plasma etching process on an oxide film of a target substrate through one or more steps by using a processing gas including a CF-based gas and a COS gas, the plasma processing method comprising:

performing a plasma etching process on the oxide film of the target substrate according to a processing recipe;

measuring a concentration of sulfur (S) remaining on the target substrate (residual S concentration) after the plasma etching process is performed according to the processing recipe;

adjusting a ratio of a COS gas flow rate with respect to a CF-based gas flow rate (COS/CF ratio) so as to allow the residual S concentration to become equal to or smaller than a predetermined value; and performing an actual plasma etching process according to a modified processing recipe storing the adjusted COS/CF ratio.

2. The plasma processing method of claim 1, wherein, if the residual S concentration on the target substrate exceeds the predetermined value after the plasma etching process is performed according to the processing recipe, the COS/CF ratio in the processing recipe is reduced, and the actual etching process is performed according to the modified processing recipe storing the reduced COS/CF ratio.

3. The plasma processing method of claim 2, wherein the COS/CF ratio is reduced by either reducing the COS gas flow rate or increasing the CF-based gas flow rate, or by both reducing the COS gas flow rate and increasing the CF-based gas flow rate.

4. The plasma processing method of claim 2, wherein, after the actual plasma etching process is performed according to the modified processing recipe, the residual S concentration is measured again, and adjusting a COS/CF ratio, performing an actual etching process and measuring a residual S concentration are repeated until the residual S concentration becomes equal to or smaller than the predetermined value.

5. The plasma processing apparatus of claim 1, wherein, if the residual S concentration on the target substrate is equal to or smaller than the predetermined value after the plasma etching process is performed according to the processing recipe, the COS/CF ratio in the processing recipe is increased within a tolerance range of the residual S concentration, and the actual plasma etching process is performed according to the modified processing recipe storing the increased COS/CF ratio.

6. A plasma processing method for performing a plasma etching process on an oxide film of a target substrate through one or more steps by using a processing gas including a CF-based gas and a COS gas, the plasma processing method comprising:

investigating a relationship between a ratio of a COS gas flow rate with respect to a CF-based gas flow rate (COS/CF ratio) during a plasma etching process and a concentration of sulfur (S) remaining on the target substrate (residual S concentration) after the plasma etching process is performed;

determining the COS/CF ratio within a range in which the residual S concentration does not exceed a predetermined value; and performing a plasma etching process based on the determined COS/CF ratio.

7. A plasma processing method for performing a plasma etching process on an oxide film of a target substrate through one or more steps by using a processing gas including a CF-based gas and a COS gas, the plasma processing method comprising:

performing a plasma etching process on the oxide film of the target substrate according to a processing recipe;

measuring a concentration of sulfur (S) remaining on the target substrate (residual S concentration) after the plasma etching process is performed according to the processing recipe;

adjusting a product ((COS/CF)×etching time) of a ratio of a COS gas flow rate with respect to a CF-based gas flow rate and an etching time for performing a plasma etching process by using the processing gas including the CF-based gas and the COS gas, so as to allow the residual S concentration to become equal to or smaller than a predetermined value; and performing an actual plasma etching process according to a modified processing recipe storing the adjusted (COS/CF)×etching time.

8. The plasma processing method of claim 7, wherein, if the residual S concentration on the target substrate exceeds the predetermined value after the plasma etching process is performed according to the processing recipe, a value of ((COS/CF)×etching time) in the processing recipe is reduced, and the actual etching process is performed according to a modified processing recipe storing the reduced value of ((COS/CF)×etching time).

9. The plasma processing method of claim 8, wherein the value of ((COS/CF)×etching time) is reduced by at least one of reducing the COS gas flow rate, increasing the CF-based gas flow rate and reducing the etching time.

10. The plasma processing method of claim 7, wherein, if the residual S concentration on the target substrate is equal to or smaller than the predetermined value after the plasma etching process is performed according to the processing recipe, a value of ((COS/CF)×etching time) in the processing recipe is increased within a tolerance range of the residual S concentration, and the actual etching process is performed according to the modified processing recipe storing the increased value of ((COS/CF)×etching time).

11. A plasma processing method for performing a plasma etching process on an oxide film of a target substrate through one or more steps by using a processing gas including a CF-based gas and a COS gas, the plasma processing method comprising:

investigating a relationship between a product ((COS/CF)× etching time) of a ratio of a COS gas flow rate with respect to a CF-based gas flow rate during a plasma etching process and an etching time for performing the plasma etching process by using the processing gas including the CF-based gas and the COS gas and a concentration of sulfur (S) remaining on the target substrate (residual S concentration) after the plasma etching process is performed;

determining a value of ((COS/CF)×etching time) within a range in which the residual S concentration does not exceed a predetermined value; and performing a plasma etching process based on the determined value of ((COS/CF)×etching time).

12. The plasma processing apparatus of claim 1, wherein the predetermined value of the residual S concentration is a TLV (Threshold Limit Value).

13. A computer-readable storage medium storing therein a program for controlling a plasma processing apparatus, wherein the program, when executed on a computer, controls the plasma processing apparatus to perform a plasma processing method as claimed in claim 1.

* * * * *

UNITED STATES PATENT AND TRADEMARK OFFICE
CERTIFICATE OF CORRECTION

PATENT NO. : 8,404,590 B2  Page 1 of 1
APPLICATION NO. : 13/189715
DATED : March 26, 2013
INVENTOR(S) : Sung Tae Lee et al.

It is certified that error appears in the above-identified patent and that said Letters Patent is hereby corrected as shown below:

In the specification, column 4, line 27, please add -- 18 -- after "chuck"

In the specification, column 7, line 34, please delete "$C_4F_6$" and add -- $C_4F_8$ --

In the specification, column 7, line 34, please delete "$C_sF_b$" and add -- $C_5F_8$ --

In the specification, column 7, line 43, please add -- 13 -- after "e.g., about"

In the specification, column 8, line 19, please add -- 10 -- after "about"

Signed and Sealed this
Sixteenth Day of July, 2013

Teresa Stanek Rea
*Acting Director of the United States Patent and Trademark Office*